United States Patent
Lyons et al.

(10) Patent No.: US 11,221,365 B2
(45) Date of Patent: Jan. 11, 2022

(54) CALIBRATING AN INTERFACE BOARD

(71) Applicant: Teradyne, Inc., North Reading, MA (US)

(72) Inventors: Stephen J. Lyons, San Jose, CA (US); David Tu, Newark, CA (US)

(73) Assignee: Teradyne, Inc., North Reading, MA (US)

( * ) Notice: Subject to any disclaimer, the term of this patent is extended or adjusted under 35 U.S.C. 154(b) by 204 days.

(21) Appl. No.: 16/815,132

(22) Filed: Mar. 11, 2020

(65) Prior Publication Data

US 2021/0286000 A1 Sep. 16, 2021

(51) Int. Cl.
*G01R 31/28* (2006.01)
*G01R 31/319* (2006.01)

(52) U.S. Cl.
CPC ..... *G01R 31/3191* (2013.01); *G01R 31/2889* (2013.01); *G01R 31/31905* (2013.01)

(58) Field of Classification Search
CPC .......................... G01R 33/0017; G01R 35/005
See application file for complete search history.

(56) References Cited

U.S. PATENT DOCUMENTS

| | | | |
|---|---|---|---|
| 4,864,077 A | 9/1989 | Wadell | |
| 4,894,753 A | 1/1990 | Wadell et al. | |
| 5,359,237 A | 10/1994 | Pye | |
| 5,471,136 A | 11/1995 | Pye | |
| 5,572,160 A | 11/1996 | Wadell | |
| 5,615,219 A | 3/1997 | Keating et al. | |
| 6,066,953 A | 5/2000 | Wadell | |
| 6,204,813 B1 | 3/2001 | Wadell et al. | |
| 6,275,962 B1 | 8/2001 | Fuller et al. | |
| 6,288,561 B1 | 9/2001 | Leedy | |
| 6,504,395 B1 | 1/2003 | Johnson | |
| 9,735,779 B1 | 8/2017 | Perisetty | |
| 9,755,766 B2 | 9/2017 | Wadell et al. | |

(Continued)

FOREIGN PATENT DOCUMENTS

| | | |
|---|---|---|
| KR | 10-1487979 B1 | 1/2015 |
| WO | 2002075343 A1 | 9/2002 |
| WO | 2004111768 A2 | 12/2004 |

OTHER PUBLICATIONS

Keysight Technologies, De-Embedding and Embedding S-Parameter Networks Using a Vector Network Analyzer, Application Note. (24 pages) (2004).

(Continued)

*Primary Examiner* — Tung X Nguyen
(74) *Attorney, Agent, or Firm* — Burns & Levinson LLP (57) ABSTRACT

An example test system includes a device interface board (DIB) having one or more signal transmission paths and an interface for connecting to one or more other components of the test system. Test circuitry is configured to inject test signals into the one or more signal transmission paths and to measure transmitted versions of the test signals at the interface to obtain measurement signals. One or more processing devices are configured to generate calibration factors based on differences between the injected test signals and the measurement signals, and to store the calibration factors in computer memory. The calibration factors are for correcting for effects on the test signals of the one or more signal transmission paths.

23 Claims, 3 Drawing Sheets

(56) References Cited

U.S. PATENT DOCUMENTS

| | | |
|---|---|---|
| 9,786,977 B2 | 10/2017 | Lyons et al. |
| 10,048,304 B2 | 8/2018 | King et al. |
| 10,345,418 B2 | 7/2019 | Wadell et al. |
| 2003/0085726 A1 | 5/2003 | Rutten |
| 2004/0201383 A1 | 10/2004 | Anderson |
| 2005/0079822 A1 | 4/2005 | Boose et al. |
| 2006/0082358 A1 | 4/2006 | Conner |
| 2006/0222062 A1 | 10/2006 | Kadota |
| 2006/0269278 A1 | 11/2006 | Kenoyer et al. |
| 2007/0162800 A1* | 7/2007 | Tanaka .............. G01R 31/2831 714/724 |
| 2007/0299621 A1* | 12/2007 | Lew ................. G01R 31/3191 702/89 |
| 2008/0191683 A1 | 8/2008 | Mayder |
| 2009/0128162 A1 | 5/2009 | Singleton et al. |
| 2013/0080107 A1 | 3/2013 | Flores, Jr. et al. |
| 2013/0102091 A1 | 4/2013 | King et al. |
| 2013/0260485 A1* | 10/2013 | van der Wagt .. G01R 31/31922 438/17 |
| 2014/0253099 A1 | 9/2014 | Han et al. |
| 2017/0146632 A1 | 5/2017 | Wadell et al. |
| 2017/0163358 A1 | 6/2017 | Wadell et al. |
| 2017/0170537 A1 | 6/2017 | Lyons et al. |

OTHER PUBLICATIONS

MACOM Technology Solutions Inc. (MACOM). S-Parameter S2P File Format, Rev V3. Application Note AN3009. (3 pages). (2017).

Rytting, D., Network Analyzer Error Models and Calibration Methods, Agilent Technologies, Presentation, 51 pages (2003).

International Preliminary Reporton Patentability for PCT/US2016/047976, 6 pages (dated May 22, 2018).

Written Opinion for PCT/US16/47976, 5 pages (dated Oct. 21, 2016).

International Search Report for PCT/US16/47976, 3 pages (dated Oct. 21, 2016).

International Search Report for PCT Application No. PCT/US2021/020666, dated Jun. 23, 2021, (3 pages).

Written Opinion for PCT Application No. PCT/US2021/020666, dated Jun. 23, 2021, (6 pages).

* cited by examiner

CALIBRATING AN INTERFACE BOARD

TECHNICAL FIELD

This specification relates generally to example processes for calibrating an interface board in a test system.

BACKGROUND

Automatic test equipment (ATE) includes electronics for sending signals to, and receiving signals from, a device under test (DUT) in order to test the operation of the DUT. The ATE includes test instruments, such as radio frequency (RF) or microwave instruments, which are calibrated for operation. Test instruments may be calibrated for power, noise, impedance, or other parameters at a specific connector following the input or output of the instrument. This location is called the calibration plane, and is the location to which test instrument performance is specified or known.

SUMMARY

An example test system includes a device interface board (DIB) having one or more signal transmission paths and an interface for connecting to one or more other components of the test system. Test circuitry is configured to inject test signals into the one or more signal transmission paths and to measure transmitted versions of the test signals at the interface to obtain measurement signals. One or more processing devices are configured to generate calibration factors based on differences between the injected test signals and the measurement signals, and to store the calibration factors in computer memory. The calibration factors are for correcting for effects on the test signals of the one or more signal transmission paths. The test system may include one or more of the following features, either alone or in combination.

The test signals may sweep over a range of frequencies. The one or more processing devices may be programmed to generate a user interface (UI) for display on a computer display device. The UI may be for enabling programming of multiple test system parameters including setting of the range of frequencies. Among the test signals, different test signals having different frequencies also may have different power levels. The calibration factors may correct for signal loss on the one or more signal transmission paths on the DIB.

The test system may include a probe for selectively contacting signal contacts on the DIB to inject the test signals into the one or more signal transmission paths. The computer memory may be on the DIB. The test system may include circuitry for connecting to the interface of the DIB to obtain the measurement signals.

A transmission path among the one or more transmission paths may include at least one of a passive electronic device or an active electronic device. The test circuitry may be part of a radio frequency (RF) test instrument and the one or more signal transmission paths may be configured to transmit RF signals. The test signals may have frequencies greater than 2 gigahertz (GHz). The test signals may have frequencies in the millimeter (MM) wave range. The test signals may have frequencies greater than 6 gigahertz (GHz). The test signals may have frequencies greater than 18 gigahertz (GHz).

The calibration factors may correct for changes in power in the test signals caused by transmission along the one or more signal transmission paths. The calibration factors may correct for changes in frequency of the test signals caused by transmission along the one or more signal transmission paths. The calibration factors may correct for at least one of power, linearity, or gain changes in the test signals caused by transmission along the one or more signal transmission paths. The calibration factors may correct for effects on the test signals of a length of a signal transmission path among the one or more signal transmission paths. The calibration factors may correct for effects on the test signals of lossiness or insertion loss of a signal transmission path among the one or more signal transmission paths. The calibration factors may correct for effects on the test signals of impedance of a signal transmission path among the one or more signal transmission paths.

The DIB may be one of multiple DIBs configured for use with the test system. The computer memory may be on the DIB and the calibration factors may be unique to the DIB. The computer memory may be on the DIB and the calibration factors in the computer memory may be accessible by a computing system using an application programming interface (API).

The test circuitry may be configured to output a test signal to a device under test (DUT) attached to the DIB. The DUT may be for producing an output signal in response to the test signal. The one or more processing devices may be programmed to correct the output signal based on at least one of the calibration factors.

Any two or more of the features described in this specification, including in this summary section, can be combined to form implementations not specifically described herein.

The systems and techniques described herein, or portions thereof, can be implemented using, or controlled by, a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

An example test system, such as automatic test equipment (ATE), includes test instruments that are configured to output test signals to a device under test (DUT) and to receive signals from the DUT. The signals received may be responsive to the test signals or independent thereof. Circuitry in a test instrument, such as a radio frequency (RF) receiver capable of power measurement, processes received signals to determine whether, for example, the signals are within an acceptable range and, therefore, whether the DUT passed testing. A device interface board (DIB)—also referred to as a "load board"—provides mechanical and electrical connection between the DUT and the test instruments. For example, the DIB may include signal contacts, such as ball grid array (BGA) pads, to which the DUTs connect. Electrical conduits, such as conductive traces or radio frequency (RF) cables, run between those signal contacts and the test instruments to pass signals between the test instruments and the DUTs. In some implementations, there may be one or more interposer or other interface boards that are part of, and that complete, the mechanical and electrical connection between the DUTs and the test instruments.

In some examples, ATE is calibrated up to the DIB. For example, the DIB may be the point to which test instrument performance is specified or known. This location is referred to as the calibration plane for the test instrument. Beyond the calibration plane—for example, from the calibration plane to the signal contacts—test system performance may not be specified or known. Accordingly, described herein are example techniques for calibrating an interface board such as a DIB in a test system. In some implementations, since calibration to the calibration plane is known, and the techniques described herein calibrate the remainder of the path between the calibration plane and the signal contacts on the DIB, the entirety of the signal path between the test instruments and the signal contacts on the DIB can be calibrated.

An example of a test system described in the preceding paragraph includes a DIB having one or more signal transmission paths and an interface for connecting to one or more components of the test system. Test circuitry is configured—for example, constructed, arranged, programmed, or controlled—to inject test signals into the one or more signal transmission paths and to measure transmitted versions of the test signals at the interface to obtain measurement signals. One or more processing devices are configured—for example, programmed—to generate calibration factors based on differences between the injected test signals and the measurement signals, and to store the calibration factors in computer memory on the DIB. The calibration factors correct for effects on the test signals of the one or more signal transmission paths. For example, the calibration factors may correct for a length of a signal transmission path, a lossiness or insertion loss of a signal transmission path, or an impedance of a signal transmission. The calibration factors may be unique to the DIB and may be accessed when the DIB is connected to different test systems, thereby enabling calibration to the point of the DUT.

Figure 1:
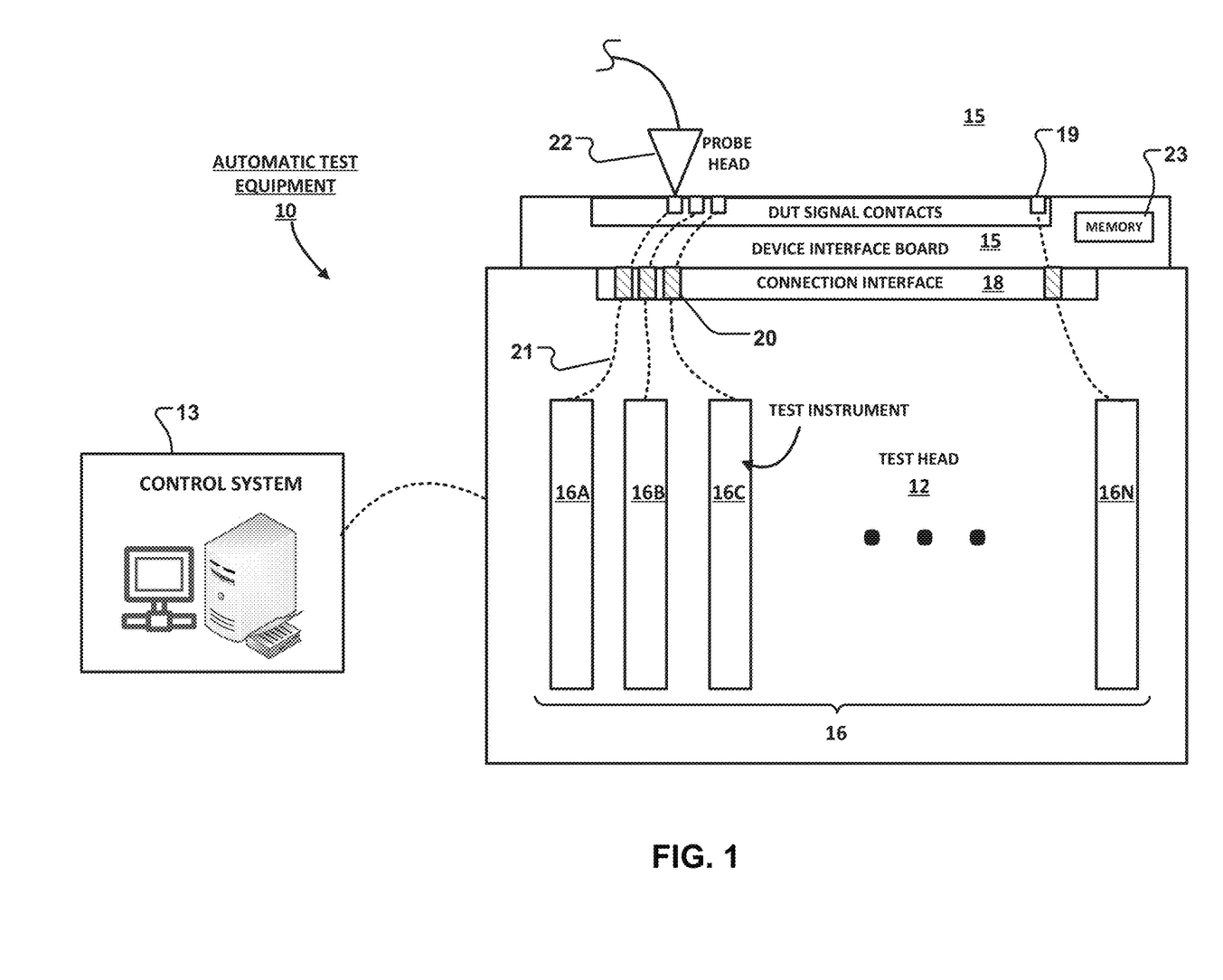
FIG. 1 is block diagram side view of components of an example test system that may be used to generate calibration factors for an interface board.

FIG. 1 shows components of example ATE 10 that may be used to implement the techniques described herein. In FIG. 1, the dashed lines represent, conceptually, potential signal paths between components of the system.

ATE 10 includes a test head 12 and a control system 13. The control system may include a computing system comprised of one or more microprocessors or other appropriate processing devices as described herein. Device interface board (DIB) 15 includes a printed circuit board (PCB) that is connected to test head 12 and that includes mechanical and electrical interfaces to one or more DUTs (not shown) that are being tested or are to be tested by the ATE. Power, including voltage, may be run via one or more conduits in the DIB to DUTs connected to the DIB.

In the example of FIG. 1, DIB 15 connects, electrically and mechanically, to test head 12. The DIB includes sites 19, which may include pins, BGA pads, or other points of electrical and mechanical connection to which the DUTs may connect. Test signals and response signals such as RF signals and other signals pass via test channels over the sites between the DUTs and test instruments. DIB 15 may also include, among other things, connectors, conductive traces and circuitry for routing signals between the test instruments, DUTs connected to sites 19, and other circuitry. DIB 15 also includes computer memory 23 for storing calibration factors for the DIB as described herein.

Control system 13 communicates with components included in the test head to control testing. For example, control system 13 may download test program sets to test instruments 16A to 16N in the test head. The test instruments include hardware devices and may include one or more processing devices and other circuitry. Test instruments 16A to 16N may run the test program sets to test DUTs in communication with the test instruments. Control system 13 may also send, to test instruments in the test head, instructions, test data, and/or other information that are usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

In an example, a test program generates a test flow to provide to the DUT. The test flow is written to output test signals to elicit a response from the DUT, for example. As noted, the test signals and responses from the DUT may include RF signals.

In the example of FIG. 1, ATE 10 includes multiple test instruments 16A to 16N, each of which may be configured, as appropriate, to perform one or more testing and/or other functions. Although only four test instruments are depicted, the system may include any appropriate number of test instruments, including those residing outside of test head 12. In some implementations, each test instrument may be configured to output analog, digital, or RF signals to test a DUT based, e.g., on data provided by the control system, and to receive analog, digital, or RF response signals from the DUT. Different test instruments may be configured to perform different types of tests and/or be configured to test different DUTs. For example, the test instruments may include an RF test instrument 16B to send RF test signals to a DUT and to receive RF response signals from the DUT. The received signals may include RF response signals that are based on the test signals and/or signals that originate from the DUT that are not prompted by (e.g., are not in response to) test signals. In some implementations, there may be electrical conductors, such as coaxial wires, between the DUT, the DIB, and the test instrument interfaces over which test and response signals are sent.

Test signals, including RF signals, may be sent to, and received from, the DUT over multiple test channels or other electrically conductive media. In some examples, a test channel may include the physical transmission medium or media over which signals are sent from the test instrument to a DUT and over which signals are received from the DUT. Physical transmission media may include, but are not limited to, electrical conductors alone or in combination with wireless transmission media. In some examples, a test channel may include a range of frequencies over which signals are transmitted over one or more physical transmission media. A test channel may include and/or electrically connect to a conductive trace on the DIB. A test channel may also include hardware on the test instrument for receiving and digitizing signals.

In some examples, ATE 10 includes a connection interface 18 that connects test instrument test channels 21 to DIB 15. Connection interface 18 may include connectors 20 or other devices for routing signals between the test instruments and DIB 15. For example, the connection interface may include one or more circuit boards or other substrates on which such connectors are mounted. Conductors that are included in the test channels may be routed through the connection interface and the DIB. In this example, connection interface 18 is the calibration plane. That is, connection interface 18, which is part of or external to DIB 15, is the point to which the performance of ATE 10 is specified or known. For example, connection interface 18 is the point to which the performance of one or more of, or each, test instrument 16 is specified or known.

A probe 22, such as a microwave probe, is connectable to each signal contact 19 on DIB 15 to inject a signal at that contact or to receive a signal therefrom. In some implementations, the probe is part of ATE 10. In some implementations, the probe may be connected to a separate tester that controls operation of the probe.

In some implementations, the system includes RF probes. Such a system has the flexibility to measure different DUT pitches and DUT landing patterns. RF path control objects may be selected using operator guidance to obtain precise probe placement for each conductive path on the DIB.

Figure 2:
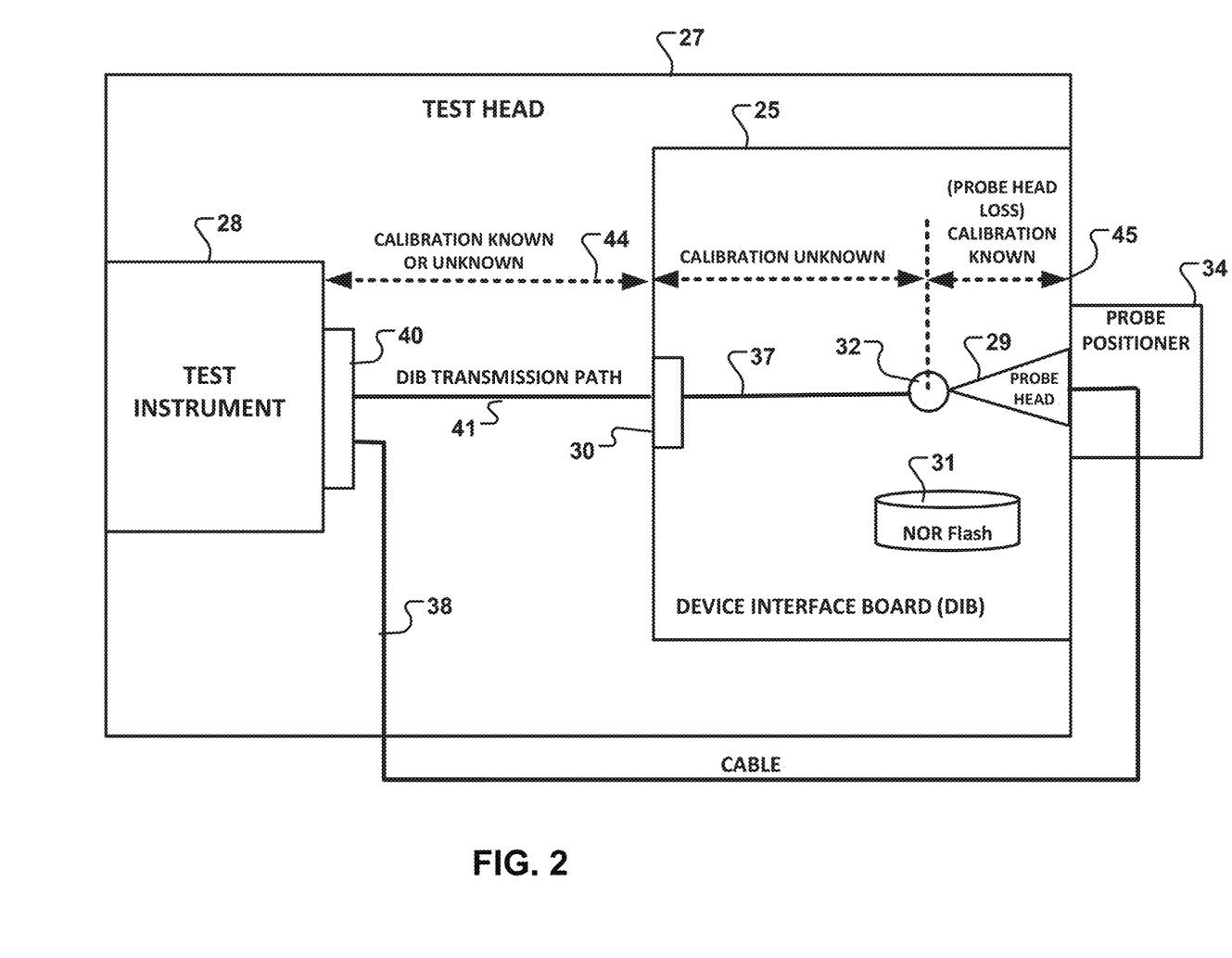
FIG. 2 is block diagram top view of components of an example test system that may be used to generate calibration factors for an interface board.

FIG. 2 is a block diagram showing another implementation of ATE that focuses on DIB calibration. In FIG. 2, DIB 25 may have the same structure and function as DIB 15 of FIG. 1; test head 27 may have the same structure and function as test head 12 of FIG. 1; test instrument 28 may have the same structure and function as a test instrument 16 of FIG. 1; and probe head 29 may have the same structure and function as probe head 22 of FIG. 1. FIG. 2 includes a connection interface 30, which may have the same structure and function as connection interface 18 of FIG. 1 and which may be part of or external to the DIB, and NOR flash memory 31 or any programmable solid state semiconductor storage, which may correspond to computer memory 23 of FIG. 1. A signal contact 32, such as a BGA, may be the same structure and function as a signal contact 19 of FIG. 1. FIG. 2 also shows a probe positioner 34 that may be configured, and controlled by test instrument 28, to selectively contact signal contacts, including signal contact 32, on DIB 25 to inject the test signals into one or more signal transmission paths 37 on the DIB. As noted, DIB transmission paths may include conductive traces, and also may include active electronic devices such as relays and passive electronic devices such as resistors and capacitors. An extension cable 38 may send control signals to the probe positioner to control movement of the probe head among the signal contacts. The control signals sent over the extension cable may also control which test signals to inject into which signal contacts to perform calibration of DIB 25 as described herein. FIG. 2 also show a connector 40 connecting test instrument 28 and DIB 25 via transmission path 41 and also connecting extension cable 38 to test instrument 28.

In the example of FIG. 2, test instrument performance and thus calibration is known for region 45 and unknown or known for region 44. In an example, calibration is known from test instrument 28 to connection interface 30 (the calibration plane) and calibration is also known for probe head 29. The example processes described herein determine calibration factors for the DIB—for example, along its conductive traces. For example, the DIB may affect levels or other features of signals passing therethrough. The processes described herein determine values (the calibration factors) that, when combined with output signal levels, produce expected signal levels or features. These calibration factors are stored in computer memory on the DIB. As such, whenever the DIB is ported to a new test system, the calibration factors will remain on the DIB and will remain accessible to the new test system. The calibration factors may be applied to signals passing through the DIB, for example, by the control system. As a result, the accuracy of the signals passing through the DIB can be maintained without re-calibrating the DIB each time the DIB is re-used. The calibration factors in the computer memory may be accessible by a computing system, such as a test instrument or control system, using an application programming interface (API).

In some implementations, the calibration plane may differ from that described in the preceding paragraphs. For example, the calibration plane may be at connector 40, at any appropriate point along transmission path 41, or at any appropriate location on the DIB. The processes described herein may be used to determine calibration factors to calibrate signals from any test system calibration plane to the DUT signal contacts.

Figure 3:
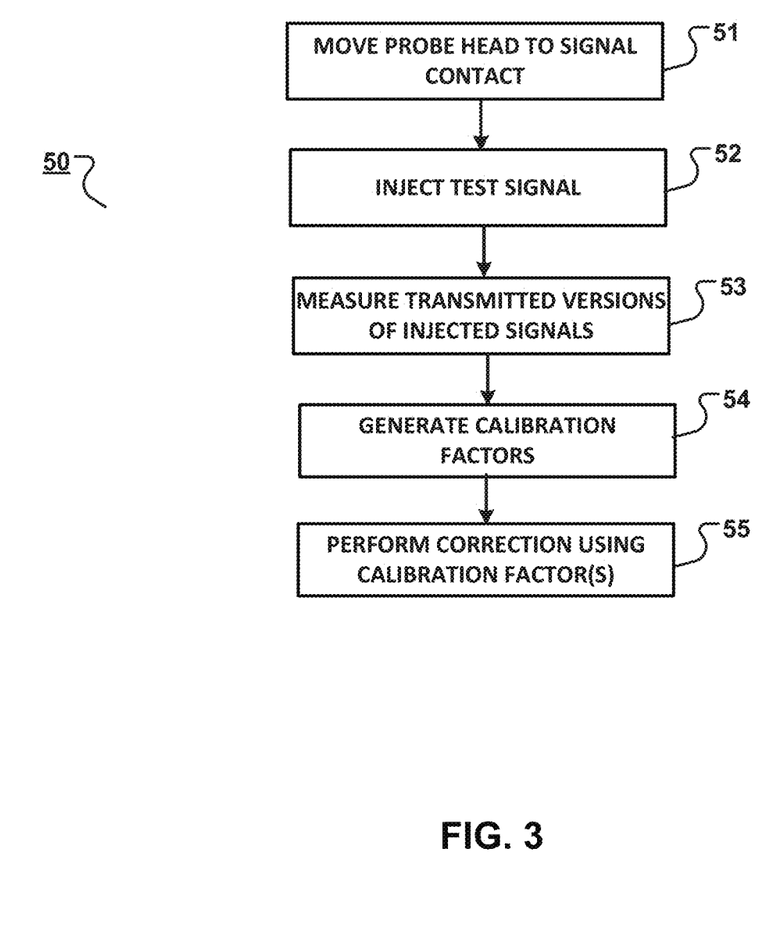
FIG. 3 is a flowchart showing operations included in an example process for generating calibration factors for an interface board and for using those calibration factors to correct a signal.

FIG. 3 shows an example process 50 for generating the calibration factors for an interface board, such as the example DIBs described herein. According to process 50, the probe head is moved (51) into contact with a signal contact on the DIB. For example, the probe head may selectively connect to signal contacts on the DIB. The probe head is controlled to inject (52) one or more test signals into the signal contact and, therefore, through one or more signal transmission paths on the DIB. In this regard, signals may be injected into each signal contact and corresponding transmission path by moving the probe head into contact with successive signal contacts. Calibrations factors may then be generated for each signal contact on the DIB and stored in computer memory 23/NOR flash memory 31 in association with an identifier for that signal contact. The calibration factors may be used to calibrate signals through those signal contacts.

In the example of FIG. 2, probe head 29 injects test signals into signal contact 32. In some examples, the probe head may be controlled by a test instrument directly, by the control system directly, or by the control system through the test instrument. For example, the control system may direct the test instrument to control the probe head to inject test signals into signal contact 32 that have characteristics specified by the control system. In some implementations, a radio frequency (RF) test instrument includes circuitry configured—for example, constructed, arranged, and/or programmed—to control, to coordinate, or to initiate in injection of the test signals.

In some implementations, the control system is configured—for example, programmed—to generate a user interface (UI) for display on a computer display device. The UI is for enabling programming of multiple test system parameters including setting parameters of the test signals. For example, the test signals injected into each signal contact may sweep over a range of frequencies. The UI may allow a user to set this range of frequencies. Among the test signals, different test signals having different frequencies also have different power levels. In some examples, for each frequency of the range of frequencies, the test signal at that frequency will have a different power level. In some examples, for each frequency of the range of frequencies, a test signal at that frequency will have a multiple different power levels. In some examples, test signals at one or more, but not all, frequencies will have different power levels. The UI may be configured to allow the user selectively to program which frequencies will have which power levels. A separate calibration factor may be determined for each signal contact/frequency/power level combination.

The test signals may have any appropriate frequencies and power levels. In some implementations, the test signals have frequencies greater than 2 gigahertz (GHz), such as 3 GHz, 4 GHz, 5 GHz, or 6 GHz. In some implementations, the test signals have frequencies greater than 6 GHz, such as 7 GHz, 8 GHz, 9 GHz, or 10 GHz. In some implementations, the test signals have frequencies greater than 18 GHz, such as 19 GHz, 20 GHz, 21 GHz, or 22 GHz. In some implementations, the test signals have frequencies that are in a range of 6 GHz to 18 GHz. In some implementations, the test signals have frequencies that are in a range of 18 GHz to 20 GHz. In some implementations, the test signals have frequencies in the millimeter (MM) wave range. According to an example definition, MM wave frequencies are a band of radio frequencies in the electromagnetic spectrum ranging from 30 GHz to 300 GHz. According to an example definition, MM wave frequencies are a band of radio frequencies in the electromagnetic spectrum ranging from 24 GHz to 100 GHz. In some implementations, the test signals have frequencies in the 5G range (e.g., the 5th generation New Radio (NR) band), including MM wave, mid-band (e.g., below 6 GHz), and/or low-band frequencies (e.g., below 1 GHz).

In the example of FIG. 2, the test signals pass through transmission path 37 to connection interface 30. Although not shown explicitly in FIG. 2, transmission path 37 may include one or multiple conductive traces and one or more active and/or passive electronic devices along one, some, or all conductive traces. Transmitted versions of the test signals injected at signal contact 32 are measured (53) at connection interface 30 to obtain measurement signals. The measurement signals may be, or include, the transmitted versions of the test signals or characteristics thereof, such as power, parametrics, and frequency. In some implementations, circuitry (not shown) connects to connection interface 30 on the DIB to obtain the measurement signals. The circuitry may include a probe or other type of sampling device.

Process 50 also includes generating (54) calibration factors based, in whole or in part, on differences between the injected test signals and the measurement signals. Process 50 stores (55) the calibration factors in computer memory 31 on the DIB. As explained herein, the calibration factors correct for effects on the test signals of one or more signal transmission paths on or through the DIB. In this regard, the DIB may be one of multiple DIBs configured for use with the test system. In some implementations, the calibration factors are unique to a specific DIB. In some implementations, all or some of the same calibration factors may be used for identical DIBs.

The calibration factors may be generated by one or processing devices, examples of which are described herein, that reside on a test instrument, on the test head, or on the control system. In some implementations, calculations to determine the calibration factors may be performed using a combination of processing performed on a test instrument and on the control system. The calculations may include determining whether a signal attribute such as signal power is as expected and, if not, producing a calibration factor that corrects the unexpected signal attribute such as signal power.

An example calibration factor (or "cal factor") calculation is set forth below, and assumes the following definitions and values.
1. source power (dBm (decibel-milliwatts)): power level of injected test signal from source
2. probe head loss (dB (decibels)): loss component on the probe head RF path.
3. extension cable loss (dB): loss over cable that connects from test instrument to probe head
4. total loss: RF path loss that causes attenuation
5. transmission line loss (dB): DIB RF transmission line trace losses
6. real source power: power DUT experiences at signal contact.
7. RF adapter: RF connector for conversion
8. corrected source power: source power that been corrected probe head loss=2 dB
extension cable loss=3 dB
transmission line loss=6 dB
source power=−10 dBm (DUT receives −10 dBm as its input at 10 GHz).

$$\text{target source power level} = \text{source power} + \text{total loss} + \text{calibration factor} \quad (1)$$

$$\text{total loss (dB)} = \text{probe head loss} + \text{extension cable loss} + \text{transmission line loss}$$

$$\text{corrected source power} = \text{target source power level} + \text{cal factor}$$

$$\text{real source power} = \text{source power} + \text{total loss}$$

real source power=−10−3−2−6=−22 dBm: this is power level of the measurement signal $$\text{target source power} = \text{real source power} + \text{calibration factor}$$

calibration factor=target source power−real source power=−10−(−22)=+12 dB so, the calibration factor=+12 dB The calibration factor may be incorporated into equation (1) to correct the source power that the DUT receives as follows:

target source power=−10 dBm (−10 dBm is what DUT receives)

$$\text{corrected source power} = \text{target source power level} + \text{cal factor} = -10 + 12 = +2 \text{ dBm} \quad (2)$$

In some implementations, the calibration factors correct for changes in power in the test signals caused by transmission along one or more signal transmission paths on the DIB. In some implementations, the calibration factors correct for changes in frequency of the test signals caused by transmission along one or more signal transmission paths on the DIB. In some implementations, the calibration factors correct for at least one of power, linearity, or gain changes in the test signals caused by transmission along one or more signal transmission paths on the DIB. In some implementations, the calibration factors correct for effects on the test signals of a length of a signal transmission path among one or more signal transmission paths on the DIB. In some implementations, the calibration factors correct for effects on the test signals of lossiness or insertion loss of a signal transmission path among one or more signal transmission paths on the DIB. In some implementations, the calibration factors correct for effects on the test signals of impedance of a signal transmission path among one or more signal transmission paths on the DIB. In implementations where the calibration plane is not at interface 30, the calibration factors may correct for any of the foregoing effects from the calibration plane to the location of the DUT signal contacts on the DIB.

Referring back to FIG. 3, during testing, test circuitry, such as a test instrument 28, is configured to output a test signal to a DUT attached to DIB 25. The DUT produces an output signal in response to the test signal. The test instrument or control system may identify the signal contact to which the DUT is connected and may identify the frequency and power level of the test signal. Knowing this information, the test instrument or control system may use an API to access calibration factors appropriate for the test signal from computer NOR flash memory 31. For example, the test instrument or control system may access calibration factors for the signal contact for a signal at a same frequency and power level as the test signal. The test instrument or control system may then correct (56) the output signal based on at least one of the calibration factors obtained from the memory. An example of a correction that may be performed is described with respect to equation (2) above.

The example systems described herein may include hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The processes described herein may be performed by systems or any other appropriate computing device. The processes can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may include a direct physical connection or an indirect connection that includes intervening components but that nevertheless allows electrical signals to flow between connected components. Any "connection" involving electrical circuitry mentioned herein through which electrical signals flow, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test system comprising:
   a device interface board (DIB) comprising one or more signal transmission paths and an interface for connecting to one or more other components of the test system;
   test circuitry to inject test signals into the one or more signal transmission paths and to measure transmitted versions of the test signals at the interface to obtain measurement signals; and
   one or more processing devices to generate calibration factors based on differences between the injected test signals and the measurement signals, and to store the calibration factors in computer memory, the calibration factors correcting for effects on the test signals of the one or more signal transmission paths.

2. The test system of claim 1, wherein the test signals sweep over a range of frequencies.

3. The test system of claim 2, wherein the one or more processing devices are programmed to generate a user interface (UI) for display on a computer display device, the UI for enabling programming of multiple test system parameters including setting of the range of frequencies.

4. The test system of claim 1, wherein, among the test signals, different test signals having different frequencies also have different power levels.

5. The test system of claim 1, wherein the calibration factors correct for signal loss on the one or more signal transmission paths on the DIB.

6. The test system of claim 1, further comprising:
   a probe for selectively contacting signal contacts on the DIB to inject the test signals into the one or more signal transmission paths.

7. The test system of claim 1, wherein the computer memory is on the DIB.

8. The test system of claim 1, further comprising circuitry for connecting to the interface of the DIB to obtain the measurement signals.

9. The test system of claim 1, wherein a transmission path among the one or more transmission paths comprises at least one of a passive electronic device or an active electronic device.

10. The test system of claim 1, wherein the test circuitry is part of a radio frequency (RF) test instrument and the one or more signal transmission paths are configured to transmit RF signals.

11. The test system of claim 1, wherein the test signals have frequencies greater than 2 gigahertz (GHz).

12. The test system of claim 1, wherein the test signals have frequencies in the millimeter (MM) wave range.

13. The test system of claim 1, wherein the test signals have frequencies greater than 6 gigahertz (GHz).

14. The test system of claim 1, wherein the test signals have frequencies greater than 18 gigahertz (GHz).

15. The test system of claim 1, wherein the calibration factors correct for changes in power in the test signals caused by transmission along the one or more signal transmission paths.

16. The test system of claim 1, wherein the calibration factors correct for changes in frequency of the test signals caused by transmission along the one or more signal transmission paths.

17. The test system of claim 1, wherein the calibration factors correct for at least one of power, linearity, or gain changes in the test signals caused by transmission along the one or more signal transmission paths.

18. The test system of claim 1, wherein the calibration factors correct for effects on the test signals of a length of a signal transmission path among the one or more signal transmission paths.

19. The test system of claim 1, wherein the calibration factors correct for effects on the test signals of lossiness or insertion loss of a signal transmission path among the one or more signal transmission paths.

20. The test system of claim 1, wherein the calibration factors correct for effects on the test signals of impedance of a signal transmission path among the one or more signal transmission paths.

21. The test system of claim 1, wherein the DIB is one of multiple DIBs configured for use with the test system, the computer memory being on the DIB and the calibration factors being unique to the DIB.

22. The test system of claim 1, wherein the computer memory is on the DIB and the calibration factors in the computer memory are accessible by a computing system using an application programming interface (API).

23. The test system of claim 1, wherein the test circuitry is configured to output a test signal to a device under test (DUT) attached to the DIB, the DUT for producing an output signal in response to the test signal; and wherein the one or more processing devices are programmed to correct the output signal based on at least one of the calibration factors.

* * * * *